(12) United States Patent
Lim

(10) Patent No.: US 7,338,880 B2
(45) Date of Patent: Mar. 4, 2008

(54) METHOD OF FABRICATING A SEMICONDUCTOR DEVICE

(75) Inventor: Keun Hyuk Lim, Chungcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 113 days.

(21) Appl. No.: 11/311,227

(22) Filed: Dec. 20, 2005

(65) Prior Publication Data

US 2006/0148194 A1    Jul. 6, 2006

(30) Foreign Application Priority Data

Dec. 31, 2004    (KR) ...................... 10-2004-0118442

(51) Int. Cl.
*H01L 21/762*    (2006.01)

(52) U.S. Cl. ............................... 438/433; 257/E21.551

(58) Field of Classification Search ................ 438/424, 438/433; 257/292, E21.546, E21.551
See application file for complete search history.

(56) References Cited

U.S. PATENT DOCUMENTS

| | | | |
|---|---|---|---|
| 6,251,744 B1 * | 6/2001 | Su et al. ...................... 438/400 |
| 6,323,054 B1 * | 11/2001 | Yaung et al. .................. 438/75 |
| 6,514,833 B1 * | 2/2003 | Ishida et al. ................. 438/424 |
| 6,569,700 B2 * | 5/2003 | Yang ............................ 438/48 |
| 6,989,318 B2 * | 1/2006 | Doris et al. .................. 438/433 |
| 7,060,960 B2 * | 6/2006 | Ohta et al. ................. 250/214.1 |
| 7,091,536 B2 * | 8/2006 | Rhodes et al. .............. 257/291 |
| 2005/0139877 A1 * | 6/2005 | Rhodes et al. .............. 257/292 |
| 2005/0179071 A1 * | 8/2005 | Mouli ......................... 257/291 |
| 2006/0001043 A1 * | 1/2006 | Shim .......................... 257/183 |
| 2006/0017132 A1 * | 1/2006 | Birner et al. ................ 257/510 |

* cited by examiner

*Primary Examiner*—M. Wilczewski
(74) *Attorney, Agent, or Firm*—McKenna Long & Aldridge LLP

(57) ABSTRACT

A method of fabricating a semiconductor device includes steps of forming at least one shallow-trench isolation region in a semiconductor substrate; forming a photoresist pattern for blocking a photodiode region; sequentially implanting dopant ions and boron ions into the at least one shallow-trench isolation region; and activating the implanted ions. Since germanium ions are implanted before implanting P-type ions in a channel-stop ion implantation process, the lattice structure of the surface of a shallow-trench isolation region is maintained, to thereby allow a deeper penetration of the implanted P-type ions (boron ions), and to prevent the P-type ions from being outwardly diffused according to an increased lattice scattering phenomenon generated upon a thermal process.

5 Claims, 3 Drawing Sheets

METHOD OF FABRICATING A SEMICONDUCTOR DEVICE

CROSS REFERENCE TO RELATED APPLICATIONS

This application claims the benefit of Korean Patent Application No. 10-2004-0118442, filed on Dec. 31, 2004, which is hereby incorporated by reference as if fully set forth herein.

BACKGROUND OF THE INVENTION

1. Field of the Invention

The present invention relates to a method of fabricating a semiconductor device, and more particularly, to a method of fabricating a semiconductor device in which germanium ions are implanted before implanting P-type ions in a channel-stop ion implantation process, such that the lattice structure of the surface of a shallow-trench isolation region is maintained to thereby allow a deeper penetration of the implanted P-type ions (boron ions), and to prevent the P-type ions from being outwardly diffused according to an increased lattice scattering phenomenon generated upon thermal processing.

2. Discussion of the Related Art

An imaging device for converting an optical image into an electrical signal may be realized by a charge-coupled device or a CMOS image sensor. A CMOS image sensor uses CMOS fabricating technology.

CMOS image sensors include a photosensitive portion for sensing light and a logic circuit for processing the sensed light into an electrical signal. The unit pixel of the CMOS image sensor may be composed of one photodiode and four NMOS transistors. Typically, the four transistors are a transfer transistor, for transferring an optical charges collected in the photodiode to a floating node, a reset transistor, for setting the potential of the node to a desired value, discharging charges, and resetting the floating node, a drive transistor, functioning as a source follower buffer amplifier, and a select transistor, functioning as a switch for addressing. Among these transistors, the transfer transistor and the reset transistor are formed of native NMOS transistors having depletion modes or low threshold voltages, to improve charge transfer efficiency and reduce a charge loss (voltage drop) in the output signal. In the unit pixel of the CMOS image sensor, the potential barriers of the transfer transistor and the reset transistor are controlled such that the reset of the floating node is performed through the transfer transistor and the reset transistor, and excessive charges in a saturation region flow into a power line through the transfer transistor and the reset transistor.

FIGS. 1A-1C illustrate a method of fabricating a CMOS image sensor according to the related art.

Referring to FIG. 1A, a trench is formed in a silicon substrate 101 to form a shallow-trench isolation region 102.

Referring to FIG. 1B, P-type ions, such as $BF_2$ or boron, are implanted into the shallow-trench isolation region 102 of the silicon substrate 101 while covering the photodiodes 103 with a photoresist 104. The N-type photodiode and the shallow-trench isolation region 102 are separated from each other, and thus leakage in the interface of the shallow-trench isolation region 102 is removed and isolation is improved.

Referring to FIG. 1C, because the boron is light in weight it is outwardly diffused upon a post-thermal process. Thus, the boron cannot perform its function well because upon thermal processing the P-type region 105 becomes wider, and the photodiode 103 becomes narrower.

SUMMARY OF THE INVENTION

Accordingly, the present invention is directed to a method of fabricating a semiconductor device that substantially obviates one or more problems due to limitations and disadvantages of the related art.

An advantage of the present invention is that it can provide a method of fabricating a semiconductor device, in which germanium ions are implanted before implanting P-type ions in a channel-stop ion implantation process, to maintain the lattice structure of the surface of a shallow-trench isolation region and thereby allow a deeper penetration of the P-type ions (boron ions) and to prevent the implanted P-type ions from being outwardly diffused according to an increased lattice scattering phenomenon generated upon thermal processing.

Additional features and advantages of the invention will be set forth in part in the description which follows, and in part will become apparent from the description, or may be learned by practice of the invention. These and other advantages of the invention may be realized and attained by the structure particularly pointed out in the written description and claims hereof as well as the appended drawings.

To achieve these and other advantages in accordance with the purpose of the invention, as embodied and broadly described herein, a method of fabricating a semiconductor device comprises forming at least one shallow-trench isolation region in a semiconductor substrate; forming a photoresist pattern for blocking a photodiode region; sequentially implanting dopant ions and boron ions into the at least one shallow-trench isolation region; and activating the implanted ions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention.

In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Developed in the 1960s, the CMOS image sensor has a lower image quality, a more complex circuitry, a lower packing density, and a larger chip size than a charge-coupled device (CCD) and offers no cost benefits. In the late 1990s, however, these disadvantages began to disappear with the development of CMOS fabricating technology and improvements in signal processing algorithms. By selectively applying CCD fabrication processing to CMOS image sensor technology, the quality of a CMOS image sensor can be significantly improved.

FIGS. 2A-2E illustrate a method of fabricating a CMOS image sensor according to the present invention.

Figure 1A:
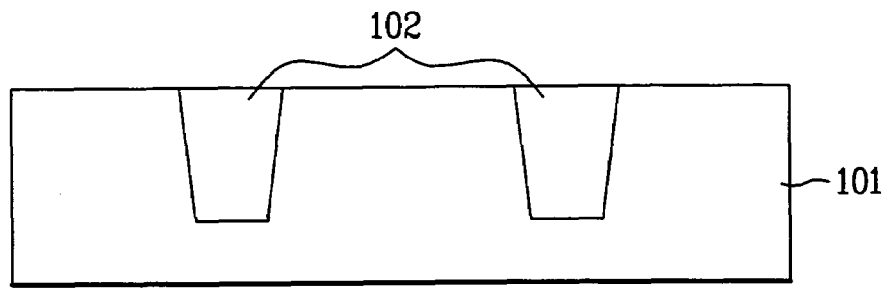
FIGS. 1A-1C are cross-sectional views for illustrating a method of fabricating a CMOS image sensor according to the related art.
Figure 1B:
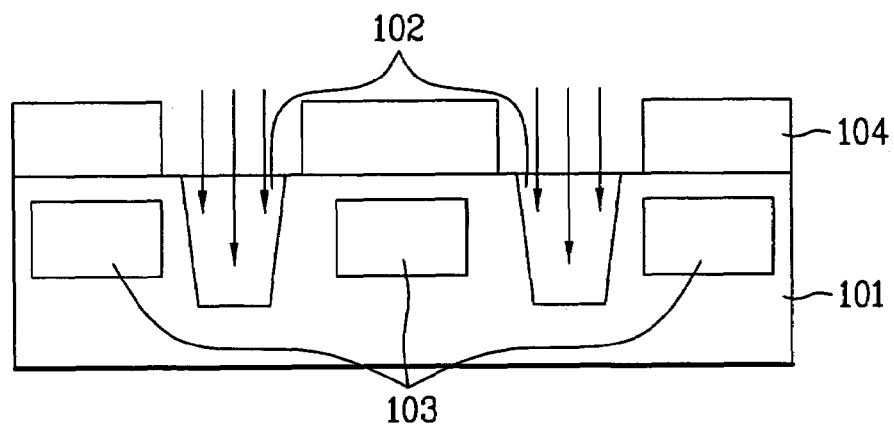
Figure 1C:
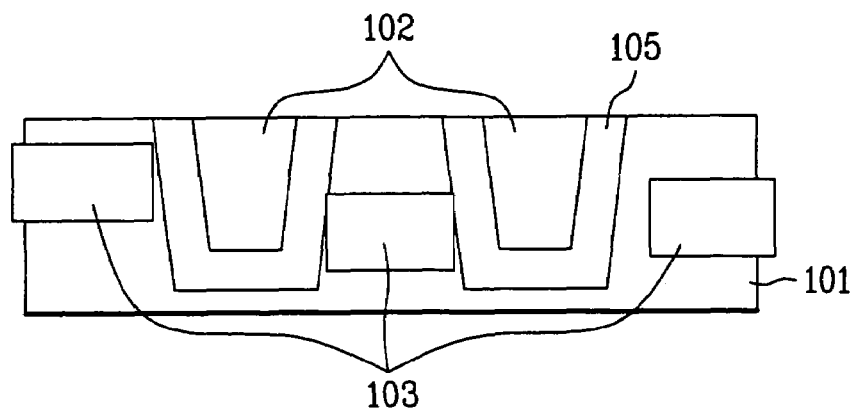
Figure 2A:
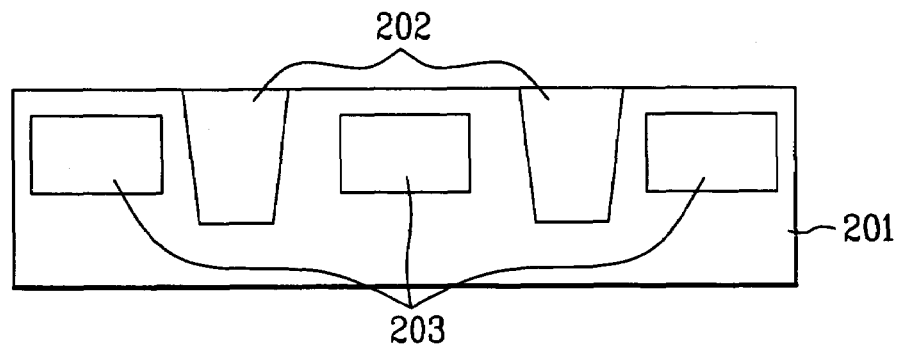
FIGS. 2A-2E are cross-sectional views for illustrating a method of fabricating a CMOS image sensor according to an exemplary embodiment of the present invention.

Referring to FIG. 2A, a semiconductor substrate 201 is etched to form shallow-trench isolation regions 202. Photodiode regions 203 are formed between the shallow-trench isolation regions 202.

Figure 2B:
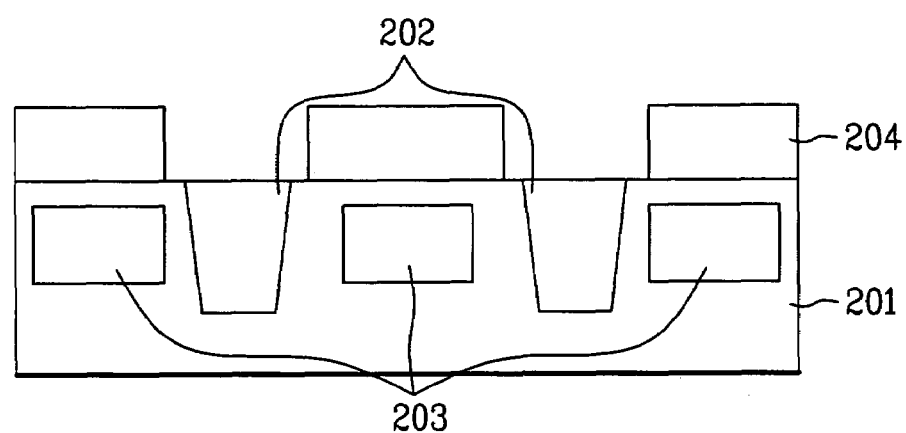

Referring to FIG. 2B, photoresist 204 is formed and patterned to block the photodiode regions 203.

Figure 2C:
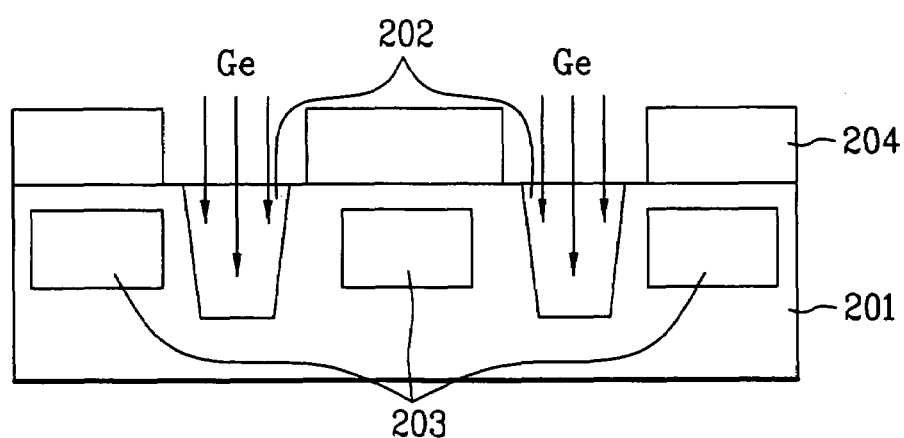
Figure 2D:
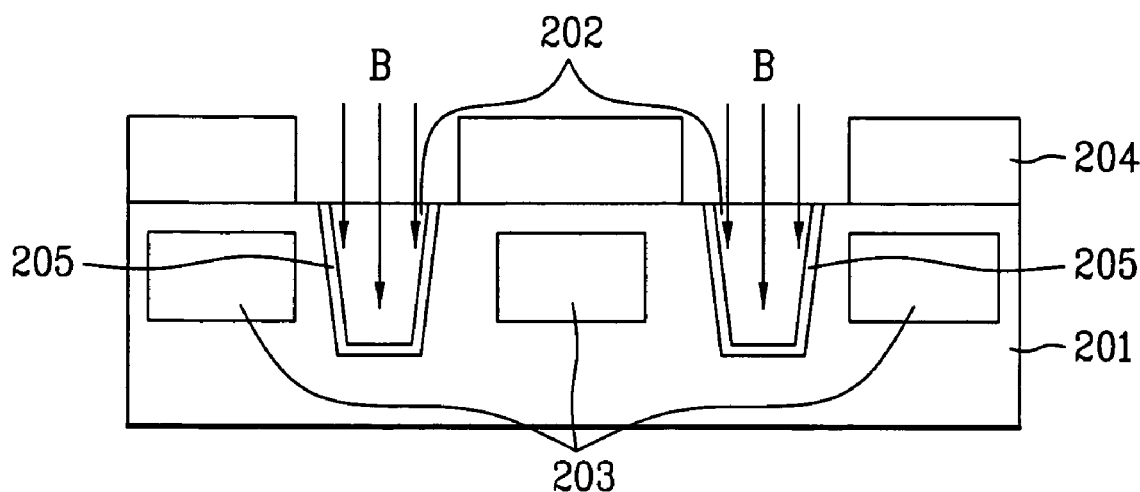

Referring to FIGS. 2C and 2D, dopant ions, such as germanium (Ge), are implanted into the shallow-trench isolation regions 202 to form a germanium region 205 before implanting boron (B) ions. Then, P-type ions such as boron ions are implanted into the shallow-trench isolation regions 202. In this manner, it may be possible to prevent the outward diffusion of the implanted boron ions during a post-thermal process.

Figure 2E:
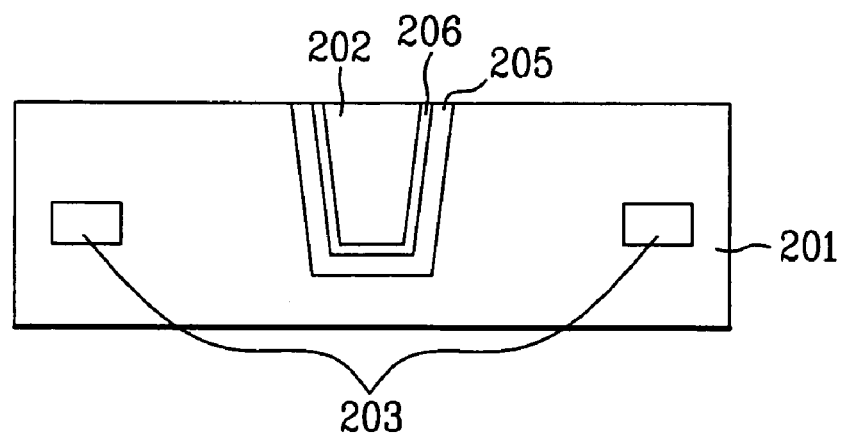

Referring to FIG. 2E, by forming the germanium region 205, the boron ions are not spread to a region other than a boron region 206 and are collected in the vicinity of the shallow-trench isolation regions 202.

According to an exemplary embodiment of the present invention, since germanium ions are implanted before implanting P-type ions in a channel-stop ion implantation process, the lattice structure of the surface of a shallow-trench isolation region may be maintained to thereby allow a deeper penetration of the P-type ions (boron ions), and to prevent the implanted P-type ions from being outwardly diffused according to an increased lattice scattering phenomenon generated upon a thermal process.

It will be apparent to those skilled in the art that various modifications and variations can be made in the present invention without departing from the spirit or scope of the invention. Thus, it is intended that the present invention covers such modifications and variations provided they come within the scope of the appended claims and their equivalents.

What is claimed is:

1. A method of fabricating a semiconductor device, comprising:
    forming at least one shallow-trench isolation region in a semiconductor substrate;
    forming a photoresist pattern for blocking a photodiode region;
    sequentially implanting dopant ions and boron ions into the at least one shallow-trench isolation region; and
    activating the implanted ions;
    wherein the dopant ions are germanium.

2. The method according to claim 1, wherein the implanted boron ions are P-type ions.

3. The method according to claim 1, wherein the at least one shallow-trench isolation region comprises an adjacent pair of shallow-trench isolation regions.

4. The method according to claim 3, wherein the photodiode region occurs between the shallow-trench isolation regions.

5. The method according to claim 1, wherein the implanted ions are activated by performing a thermal process.

* * * * *